United States Patent
Kay et al.

(12)

(10) Patent No.: US 6,442,818 B1
(45) Date of Patent: Sep. 3, 2002

(54) METHOD FOR POSITIONING COMPONENTS HAVING CRITICAL POSITIONING TOLERANCES FOR ATTACHMENT TO A CIRCUIT BOARD

(75) Inventors: Jason A. Kay, Ramsey; David S. Kerr, Morris Plains, both of NJ (US); Ivan Pawlenko, Holland; Larry Samson, Langhorne, both of PA (US); Richard Schwartz, Cranbury, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/537,051

(22) Filed: Mar. 28, 2000

(51) Int. Cl.⁷ ............................................. B25B 27/14
(52) U.S. Cl. ..................... 29/281.1; 29/739; 29/740; 29/760; 29/832; 269/903
(58) Field of Search ................. 29/281.1, 739, 29/740, 741, 758, 760, 748–754, 832, 836, 837; 269/289, 903

(56) References Cited

U.S. PATENT DOCUMENTS

| | | | | |
|---|---|---|---|---|
| 3,117,370 A | * | 1/1964 | Kauppi et al. ................. | 29/749 |
| 5,199,889 A | * | 4/1993 | McDevitt, Jr. ................ | 29/843 |
| 5,429,511 A | * | 7/1995 | DelPrete et al. .............. | 439/69 |
| 6,115,909 A | * | 9/2000 | Miller .......................... | 29/741 |

* cited by examiner

Primary Examiner—Rick K. Chang
(74) Attorney, Agent, or Firm—Woodbridge & Associates, P.C.; Richard C. Woodbridge, Esq.

(57) ABSTRACT

A method to precisely position an electronic component within a cutout on a printed circuit board before attachment to said board. A nest precisely positions and firmly holds the component in place. Inner walls of the nest match the component's dimensions while the outer walls are stepped and match the cutout dimensions. In the preferred embodiment, the nest is mounted on a top plate above the circuit board. The operator places and centers the component in the nest, by means of the nest's shape or leaf springs which hold the component centered. Components are positioned by wiggling the nest until the stepped sides engage the PCB. In an alternative embodiment, the operator turns an eccentric cam applying force to a spring, pushing the component towards one edge of the nest for alignment. Both embodiments, hold the component so the operator can fasten the component to the board with both hands.

8 Claims, 8 Drawing Sheets

METHOD FOR POSITIONING COMPONENTS HAVING CRITICAL POSITIONING TOLERANCES FOR ATTACHMENT TO A CIRCUIT BOARD

BACKGROUND OF THE INVENTION

1. Field of the Invention

The present invention lies in the area of printed circuit board (PCB) component assembly and manufacturing.

2. Description of the Related Art

In radio frequency (RF) products, certain components must be positioned to be attached through the circuit board and onto a mounting plate (also called a casting) that backs the circuit board within extremely tight positioning tolerances. The proposed invention provides an economical method for eliminating variances in positioning mechanics that occur when human operators position components manually.

Many RF assemblies consist of a printed circuit board fastened onto a mounting plate. This plate serves as both a ground reference and a thermal heat sink. Although some of the RF components are mounted to the surface of the PCB via the conventional surface mount procedures, others are mounted to both the PCB and to the mounting plate, again for reasons of ground references and thermal conductivity. RF transistors, for example, are typically mounted to both the PCB and the mounting plate. In either case, the component is mounted in a component cutout found on the PCB. The mounting plate itself may contain a component cutout if the component is to be mounted to the mounting plate.

Because the frequencies involved are high (for this invention, this means over about 250 MHz), the length of the RF waves on the circuit board are short (several inches). For RF circuits the correct performance of the assembly depends on accurately locating the components and circuit board to a small fraction of the wavelength, in accordance with the design intent. If either the components or the PCB are located incorrectly relative to each other, both electrical (RF) and thermal performance will be degraded. If the misalignment is severe, in addition to degraded performance, reliability may be significantly impaired to the extent of catastrophic failure when the unit is turned on.

At relatively low frequencies and power levels (a few hundred MHz and a few watts) an alignment tolerance of 0.010" to 0.025" would generally be adequate. The exact tolerance would be determined by CAD simulation or through testing. As the frequency and/or the power levels increase, the tolerance for positioning the PCB on the plate, as well as the tolerance for positioning the components on the PCB, decreases. At a frequency of 1 GHz and a power level of tens of watts, the tolerance allowed for correct performance may be as small as 0.001" to 0.005". Consistency of position from one assembly to the next is also important in order to maintain the same performance of all assemblies.

Tolerances this small are difficult, time-consuming, or expensive to achieve on a production basis. Among the problems encountered is that a component is designed to fit into a cutout of the PCB, but the cutout provides for too much spacing. The component could be placed into the cutout but still not be aligned precisely enough for the PCB. More importantly, the cutouts on the PCB and the mounting plate are capable of being cut to the same dimensions in a production environment but are not generally capable of being consistently positioned while in production. Thus, any given component is subject to incorrect positioning both relative to its cutout and relative to other components.

The prior art solutions for properly positioning components generally involve manual techniques: human operators currently place the component into the cutout in the circuit board and casting, manually align the component with the proper edge of the cutout, then while holding the component in place with one hand, obtain screws and a screwdriver, position the screws, and drive them into place. This method, while simple, runs the risk of damaging the component because the operator must exert pressure to hold the component. For example, the operator must exert pressure to keep the component in position into the PCB aperture, as well as when the operator aligns the component to the edge of the PCB aperture.

More importantly, operator placement of the component is rough and repeatable precision is difficult to achieve with the human eye. Although this could be solved with a machine vision system, such a system may be prohibitively expensive to implement. Finally, the component is subject to motion while the operator disengages one hand to obtain screws or a screwdriver, or the component may move when the screws are tightened.

SUMMARY OF THE INVENTION

Briefly described, the invention comprises a method and apparatus for positioning electronic components prior to their assembly onto a printed circuit board and backing plate. The preferred embodiment of the invention consists of a floating nest that fits in an aperture on a top plate. The top plate rests on top of the printed circuit board and mounting plate and the nest itself fits loosely in the top plate aperture to allow for positioning.

In the preferred embodiment, the operator places the component in the nest and wiggles the nest until the walls of the nest engage the edge of the PCB aperture, aligning the nest with the PCB aperture. External springs permit the nest to be wiggled into position, and springs on the nest's internal walls center the component relative to the nest. The component can then be permanently fastened to the board and the mounting plate.

In an alternative embodiment, the floating nest is enhanced to allow for use of a pushing force in aligning the component. An eccentric cam is used to move a push plate that in turn applies pressure to a leaf spring that abuts the component to be positioned. In this embodiment, the operator places the component in the nest and then pushes the component until the component is pushed into proper position. The enhanced nest permits the operator to precisely position and hold the component towards one edge of the nest, rather than centering the component.

DETAILED DESCRIPTION OF THE INVENTION

During the course of this description, like numbers will be used to identify like elements according to different views illustrating the invention.

Figure 1:
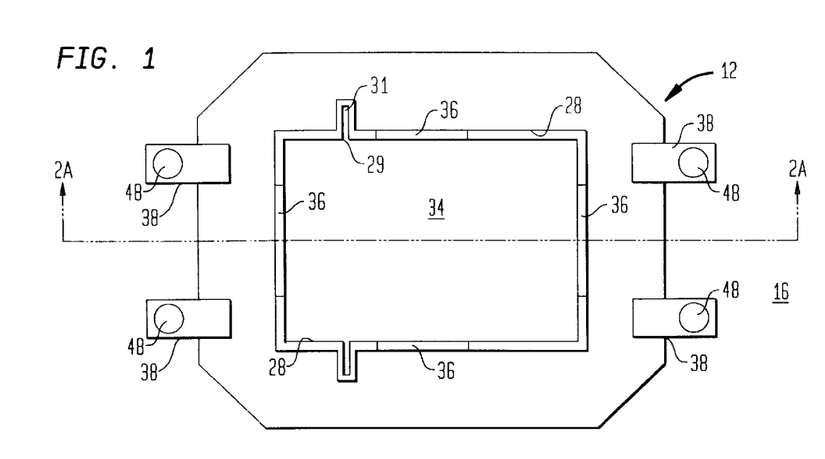
FIG. 1 illustrate the basic floating nest of the preferred embodiment.
Figure 2A:
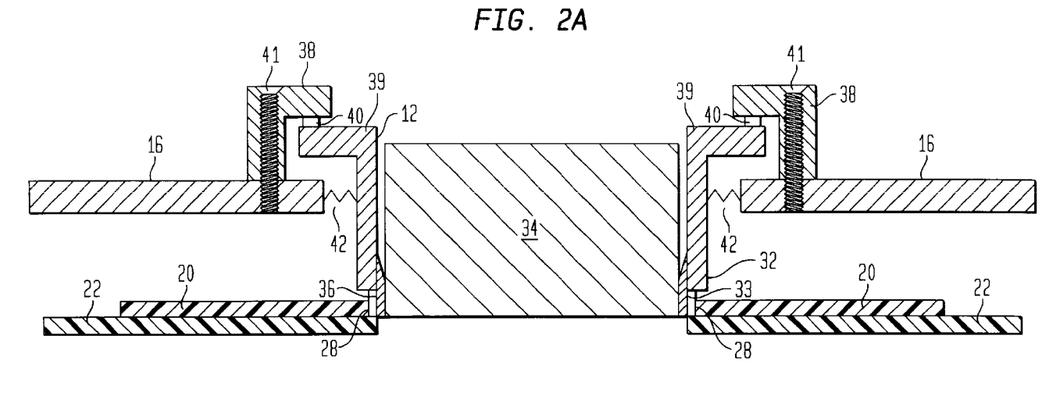
FIG. 2A is a view taken along line 2A—2A of FIG. 1.
Figure 2B:
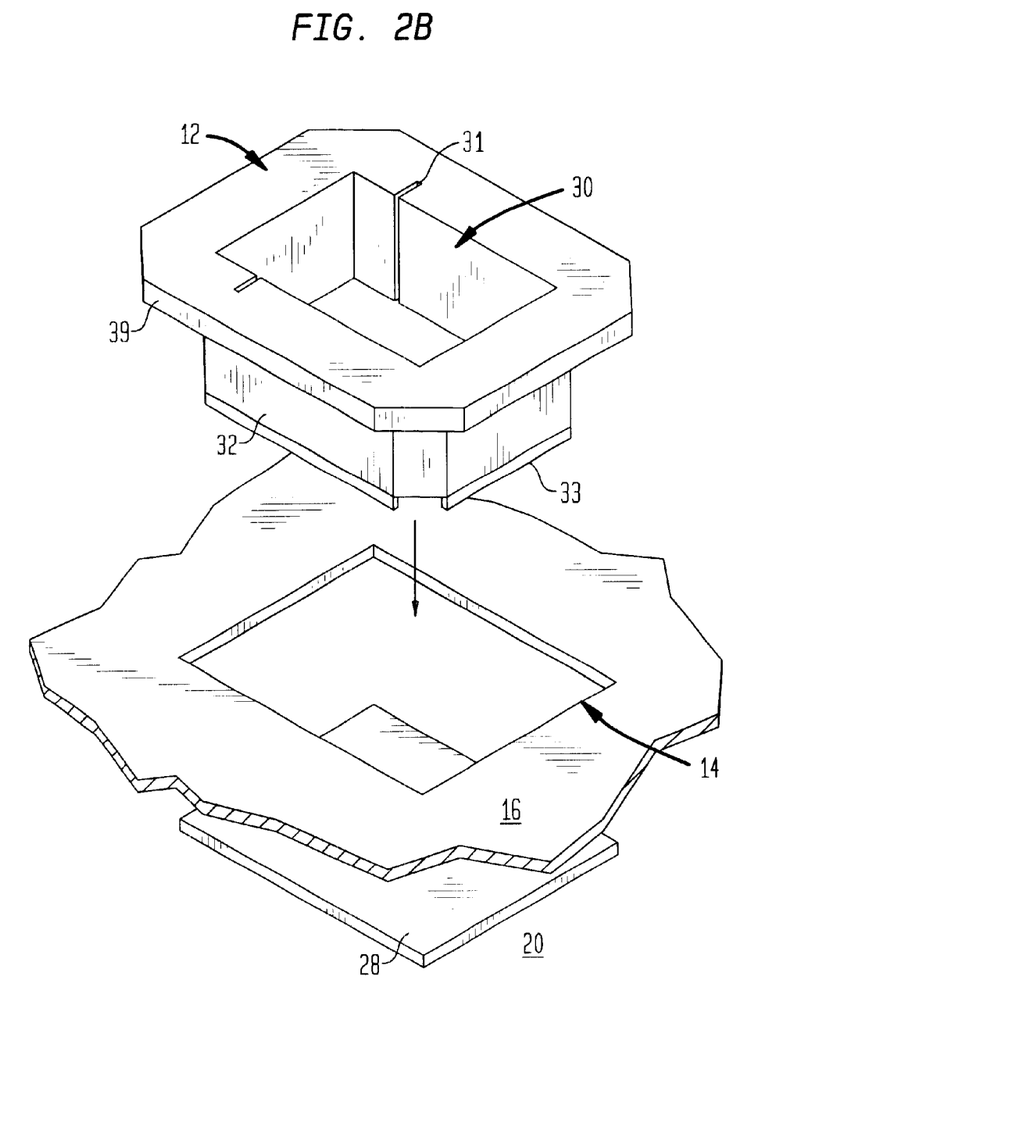
FIG. 2B is an exploded view without springs or mounting brackets illustrating how the basic floating nest fits into an aperture on the top plate as well as its relation to the PCB below.
Figure 3:
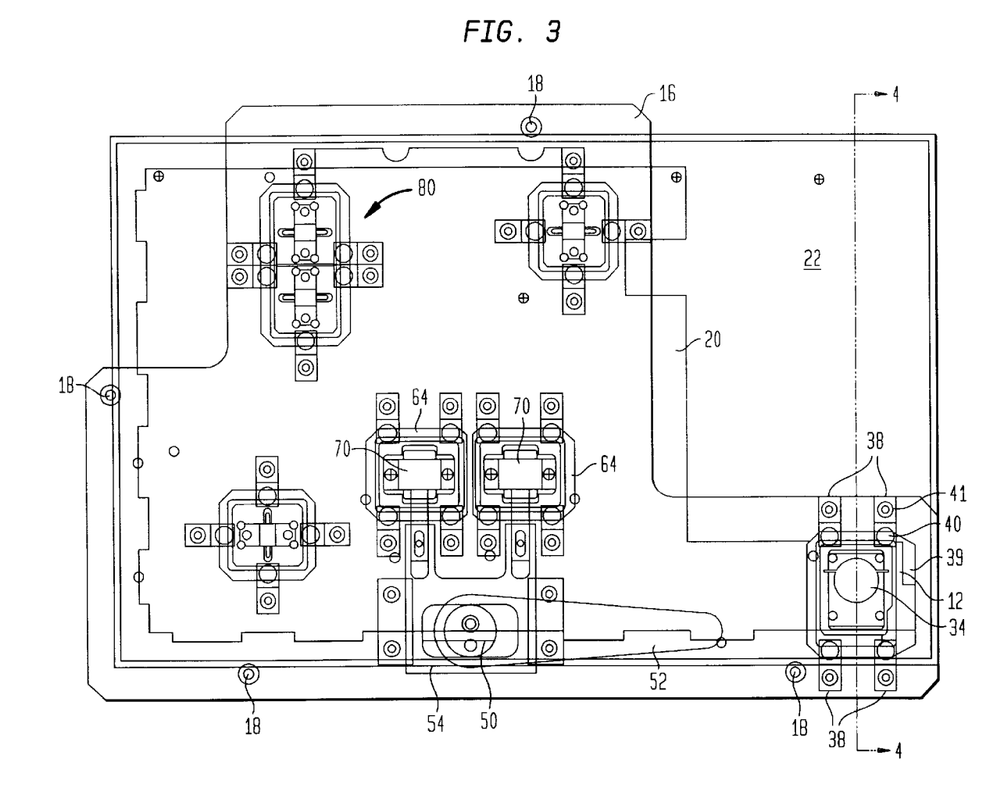
FIG. 3 illustrates the top plate with several different embodiments of the floating nest, along with the PCB and the mounting plate.
Figure 4:
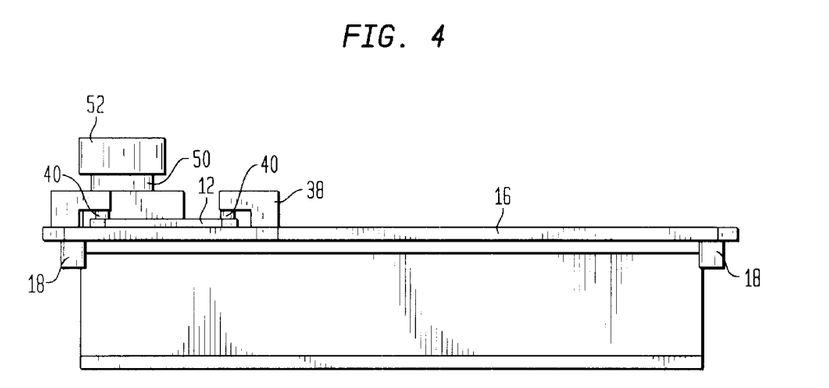
FIG. 4 is a sectional view taken along line 4—4 of FIG. 3.

The present invention proposes to solve problems in positioning a component for attachment inside an aperture (also called a cutout) found on a printed circuit board (PCB) and a mounting plate. The preferred embodiment of the invention is illustrated in FIGS. 1–3 and consists of a basic floating nest 12 that is mounted inside an aperture 14 in a top plate (also called an alignment fixture) 16 that rests upon the printed circuit board 20 and the mounting plate 22. Referring to FIG. 3, the top plate 16 is supported by four support pins 18 that contact the edge of the printed circuit board 20 and the mounting plate 22. Support pins 18 also permit the operator to perform a preliminary alignment with the printed circuit board 20 and the mounting plate 22.

As shown in FIG. 3, a typical top plate 16 usually contains multiple floating nests of different shape and size, and often different embodiments of the floating nest invention, for positioning different types of components. A preferred embodiment of the invention, however, lies in the basic floating nest illustrated in FIGS. 1–3. Each basic nest 12 is designed to fit loosely within an aperture 14 on the top plate 16, being held up by a lip 39 that drapes over the aperture 14 and rests on top plate 16. Mounting brackets 38, which are themselves fastened to the top plate 16 by fasteners 48, hang over the lip 39 of each nest 12 and prevent the nest 12 from popping up during operation. Each mounting bracket also has a vertical spring 40 that connect to the lip 39 of the nest, facilitating removal of the nest from the PCB 20. Finally, each nest also has external springs 42 that attach from each wall of the nest 12 to the top plate 16, permitting the nest to "float" inside the top plate aperture 14.

The basic nest 12 is designed to center its component as well as to move the centered component into proper position inside the PCB aperture. As shown in FIGS. 1 and 2A, the nest's inner walls 30 have dimensions that closely resemble that of the component 34, allowing the nest to tightly hold the component. Moreover, the inner walls 30 may have a notch 31 cut inside the walls for the purpose of engaging an alignment wing 29 found on the component 34, as shown in FIGS. 1 and 2B. Leaf springs 36 (FIGS. 1 and 2A) attached to the inner walls 30 also aid in keeping the component 34 centered relative to the nest 12.

The nest 12 is also designed to locate and fit into the PCB aperture 28. As shown in FIG. 2A, the height of the floating nest walls must initially be enough to fit into both the aperture 14 on the top plate 16 and the aperture 28 found in the PCB 20. The external nest walls 32 themselves do not project into the PCB aperture, but their stepped sides 33 do. Consequently, the stepped sides 33 must have dimensions that allow them to fit snugly into the PCB aperture. The stepped sides 33 typically help define the inner walls 30 as shown in FIG. 2A, but may in fact be located on the outside walls to permit alignment of components 34 that are not close to the edge of the PCB aperture 28.

The apparatus requires that the PCB 20 itself must be precisely aligned and fastened to the mounting plate 22 before any components are aligned. The operator must first align and fasten the PCB 20 to the plate 22 using either the method and apparatus found in co-pending U.S. application Ser. No. 09/538,099 or other methods and apparatuses that are known in the prior art. The alignment of PCB 20 to mounting plate 22 is important because the apparatus of the present invention relies on the PCB aperture locations as a reference point for locating components.

Once the PCB 20 and mounting plate 22 have been aligned, the operator begins the component assembly process by placing the top plate 16 on top of the PCB and mounting plate and by placing the component(s) 34 into the basic floating nest(s) 12. The nest 12 will likely not be aligned with the PCB aperture 28 when the component 34 is first inserted, but the external springs 42 permit the operator to wiggle the nest into place. The operator essentially wiggles the nest 12 until the stepped sides 33 engage the PCB aperture 28, permitting the nest 12 to gently drop into the PCB aperture or cutout 28 as it is being biased by springs 40.

At this point, the nest 12 will essentially remain in the PCB aperture 28 until the operator pulls the nest back out, and so the component is ready for fastening. The shape of the inner walls 30 of the nest 12 hold the component 34 in place while leaf springs 36 attached to the inner walls 30 center the component 34 relative to the walls of the nest 12. Because the nest 12 remains stationary and is precisely located, the operator is able to use both hands in fastening the component 34 to the PCB 20 and/or the mounting plate 22 rather than needing one hand to firmly hold the component to the board while reaching for fastening tools. Further, during fastening, the component will only move within the confines of the walls 30.

Once the component is fastened, the operator can move on to aligning and fastening other components or can remove the top plate 16 once all components have been properly fastened. After components are fastened to the board, the operator may then solder or epoxy glue the components to the PCB or otherwise proceed with assembly.

In theory, each nest 12 could be placed in each respective cutout 28 without even a top plate as each nest would still hold and center the component relative to the cutout it is inserted in. Because most PCBs require multiple components to be aligned and fastened, however, using a single top plate 16 with multiple floating nests permits multiple components to be fastened at the same time. Thus, a single top plate 16 may contain several different floating nests located in the approximate positions of components on the PCB. Each nest may have its own set of external springs 42 and vertical springs 40, thereby moving independently of the other nests. This independence of movement enables the operator to wiggle each component into its own cutout on the PCB or mounting plate without disturbing the position of the other components.

Figure 5:
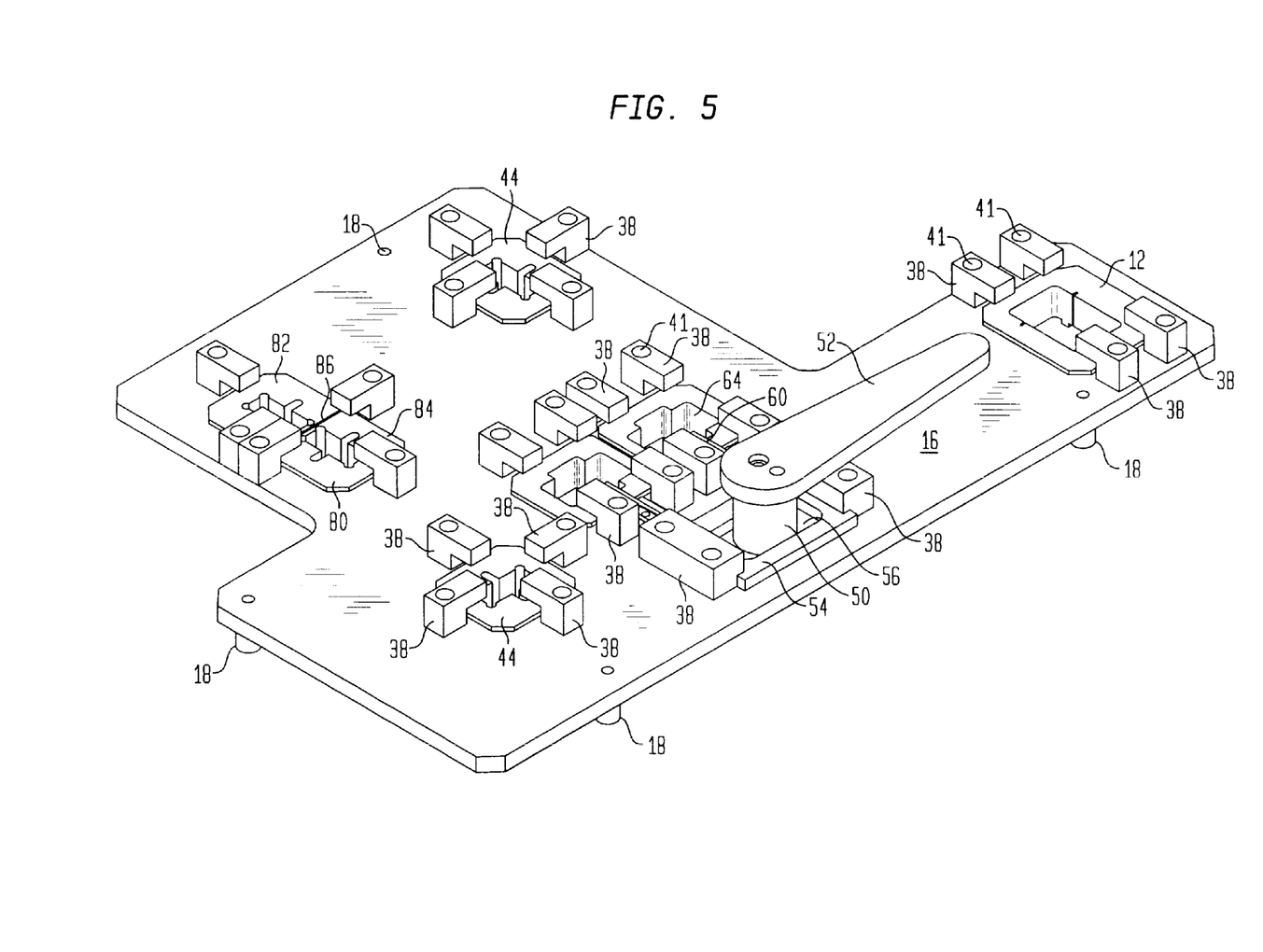
FIG. 5 illustrates a perspective view of the top plate with several different embodiments of the invention, including two nests based on the alternative embodiment with a pushing cam.
Figure 6:
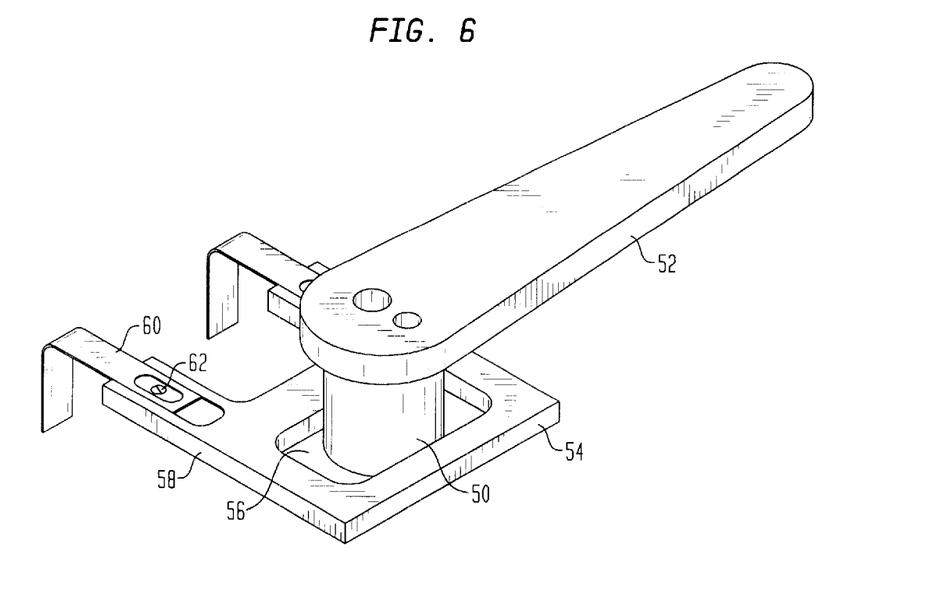
FIG. 6 is an enlarged isometric view of the pushing cam and push plate of the alternative embodiment shown in FIG. 5.
Figure 9:
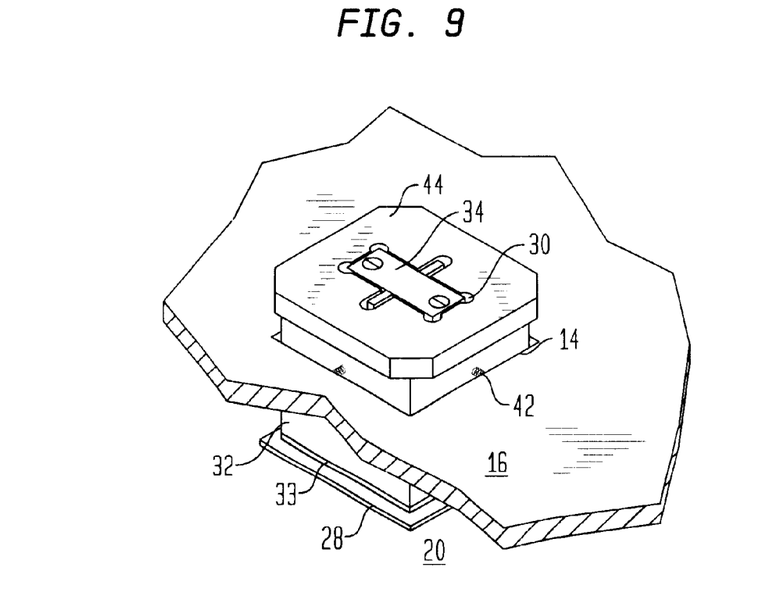
FIG. 9 illustrates a cross-shaped basic floating nest without mounting brackets.
Figure 10:
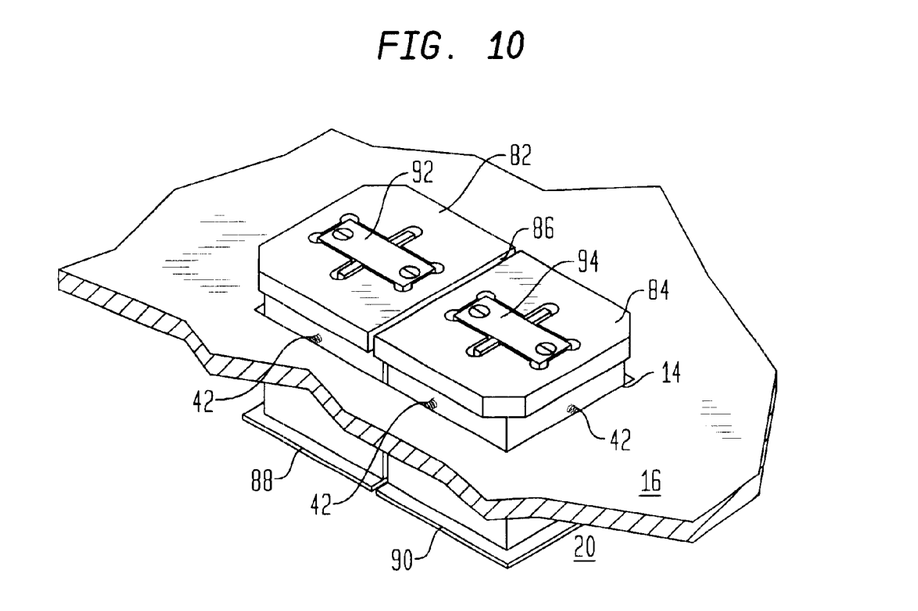
FIG. 10 illustrates the operation of two basic floating nests that are mechanically connected.

Alternately, as shown in FIG. 10, two or more different floating nests may be mechanically connected if it were important to maintain the relative position between the two components to be placed. A typical connected nest 80 (FIGS. 3, 5, and 10) will consist of two or more basic floating nests 82 and 84 that are connected by a flange or link 86. Each nest is connected to the top plate 16 with a plurality of external springs 42, allowing the two nests to be wiggled into its respective apertures 88 and 90. However, the mechanical link 86 holds the two nests in the same relative position, forcing the two nests 82 and 84 to be wiggled or adjusted in tandem. Consequently, the two components 92 and 94 will be centered as a unit relative to the center of the two apertures 88 and 90 rather than each component being centered relative to its respective aperture As shown in FIGS. 3, 5, & 9, the basic floating nest may be constructed in several different shapes to accommodate different component and aperture shapes. All of the basic nests, however, contain sides on their external walls for insertion into their respective PCB apertures and all of the basic nests attach to the top plate via external springs 42 to allow wiggling of the nest. In addition, floating nests such as the cross-shaped floating nest 44 shown in FIGS. 3, 5 & 9 may be constructed without internal leaf springs if the shape of the nest 44 automatically centers the component. Thus, although leaf springs may be added to the basic floating nest (and may be preferable), they may be omitted if the shape of the nest can hold the component in position to the required tolerance.

Figure 7:
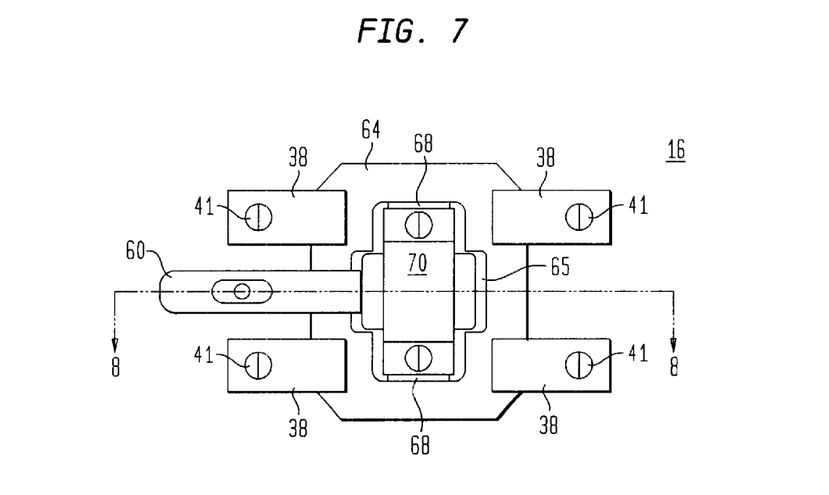
FIG. 7 is top view of a floating nest and leaf spring used in the pushing cam alternative embodiment.

In another alternative embodiment, the floating nest is enhanced by adding means for pushing and holding the component in position. Referring to FIGS. 3–8, this enhanced floating nest 64 adds to the basic nest an eccentric cam shaft 50 with a pushing handle 52. The cam shaft 50 fits inside a push plate 54, which contains an aperture 56 and is mounted to the top plate 16. The push plate 54 has at least one finger 58 that is used to hold a pushing leaf spring 60. As shown in FIG. 7, the pushing leaf spring 60 fits inside the enhanced floating nest 64, and can be adjusted with respect to the extending member 58 by means of an adjustment screw 62. The pushing leaf spring 60 thus may be moved in and out with respect to the push plate 54, depending on the size and required position of the component. In addition to the pushing spring, the enhanced floating nest retains lateral leaf springs 68 in order to center the component in the direction perpendicular to the push.

Figure 8:
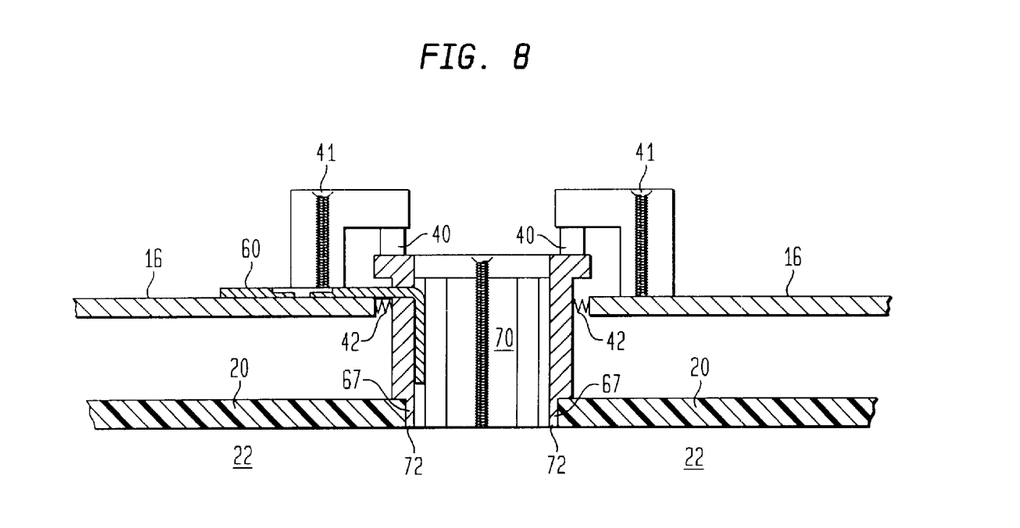
FIG. 8 is a sectional view of FIG. 7 taken along line 8—8.

Preliminary operation of the enhanced floating nest closely resembles that of the basic nest, except that the operator needs to check whether the cam is back in its initial position after placing the top plate 16 on top of the PCB 20 and the mounting plate 22. As with the basic nest, the operator places the component 70 into the enhanced floating nest 64 and attempts to locate the PCB aperture 72 by wiggling the nest 64 until the stepped sides 67 engage the aperture 72, dropping the nest 64 into the aperture 72. (FIG. 8).

Once the nest has been positioned inside the aperture, the operator checks to see that the pushing leaf spring 60 is in position to push the component 70. After the pushing leaf spring 60 is properly positioned, the operator turns the pushing handle 52, turning the cam 50 and applying force to the push plate 54 that serves as a cam follower. The push plate 54 then transfers force to the pushing spring 60, which pushes the component 70 towards the far wall 65 of the nest 64. The operator continues to turn the handle 52 until the component is pushed flush against the far nest wall 65. At the same time, the lateral leaf springs 68 keep the component centered laterally as it is being pushed. Once the component can be pushed no further, the shape of the eccentric cam and its frictional forces against the push plate will hold the component 70 in place precisely and rigidly along the far nest wall 65. As with the basic floating nest, the operator is now able to fasten the component 70 to the PCB 20 and if necessary, the mounting plate 22 without having to use one hand for pressing the component in place. Once the component has been fastened, the operator then turns the pushing handle 52 back to release the pushing springs 60. As with the basic floating nest, the top plate 16 is removed once all components have been aligned and fastened to the PCB and mounting plate, permitting further assembly steps such as soldering or epoxy gluing.

The enhanced floating nest 64 may be used to position components anywhere within an aperture but is particularly useful for positioning components near the edge of an aperture, rather than centered in the aperture. To place the component in a given position, one only needs design the nest so that the far wall 65 will be located at the point where the component will finally end up. The eccentric cam and leaf springs reduce the risk of damage as the component is pushed into place, and the leaf springs are designed to absorb any excess forces exerted in holding the component in place. One skilled in the art would select leaf springs of appropriate stiffness, as well as cam and push plate surfaces with sufficient frictional forces to move, and then hold, the push plate in position. As with the basic floating nest, the enhanced floating nest permits precise and repeatable alignment of a component while adjusting for manufacturing tolerances and reducing the risk of component damage.

While the invention has been described with reference to the preferred embodiment thereof, it will be appreciated by those of ordinary skill in the art that modifications can be made to the structure and elements of the invention without departing from the spirit and scope of the invention as a whole.

We claim:

1. A method for positioning an electronic component for attachment to a printed circuit board (PCB) comprising the steps of:

a) providing the circuit board with receiving means capable of receiving said electronic component;

b) providing a mounting plate such that said circuit board is to be mounted on said mounting plate and such that said mounting plate contains receiving means of similar dimensions to said circuit board receiving means;

c) providing a nest with a plurality of walls such that outer dimensions of said walls approximate of the circuit board receiving means and the mounting plate receiving means and inner dimensions of said walls approximate the electronic component, and outer walls contain stepped sides for alignment into the circuit board receiving means;

d) aligning said circuit board to said mounting plate so that the board and plate are precisely aligned;

e) placing said electronic component in said nest;

f) wiggling the nest so that the stepped sides of the nest engage the printed circuit board receiving means; and, g) lowering said nest into said printed circuit board receiving means and said mounting plate receiving means, thereby placing and holding the component in precise alignment for attachment to the circuit board.

2. The method of claim 1 wherein said circuit board said receiving means are apertures.

3. The method of claim 2 further comprising steps of:

h) providing a top plate with an aperture capable of receiving said nest, so that said top plate rests on top of said printed circuit board and said mounting plate; and, i) placing said nest into said top plate aperture so that said nest may be raised or lowered relative to said top plate.

4. The method of claim 3 wherein said lowering step (g) includes lowering said nest inside said circuit board and mounting plate receiving means until said of said nest engage said mounting plate receiving means and said printed circuit board receiving means.

5. The method of claim 4 wherein said mounting plate receiving means are apertures.

6. The method of claim 5 wherein said nest is attached to said top plate via just spring means and said lowering step (g) further includes a step of j) adjusting a position of said nest prior to lowering into said circuit board, mounting plate and top plate apertures.

7. The method of claim 6 wherein said nest contains means for centering said component relative to said nest and said placing step (e) further includes a step of k) centering said component relative to said nest.

8. The method of claim 7 wherein said adjusting means comprises second springing means mounted within said nest and said adjusting step (j) further includes a step of l) pushing said component so that said component is firmly held by said second springing means.

* * * * *